United States Patent [19]
Li et al.

[11] Patent Number: 5,943,382
[45] Date of Patent: Aug. 24, 1999

[54] DUAL-LOOP SPREAD-SPECTRUM CLOCK GENERATOR WITH MASTER PLL AND SLAVE VOLTAGE-MODULATION-LOCKED LOOP

[75] Inventors: Hung-Sung Li; Mangesh S. Pimpalkhare, both of Santa Clara, Calif.

[73] Assignee: NeoMagic Corp., Santa Clara, Calif.

[21] Appl. No.: 08/990,899

[22] Filed: Dec. 15, 1997

Related U.S. Application Data

[63] Continuation-in-part of application No. 08/701,814, Aug. 21, 1996, Pat. No. 5,757,338.
[51] Int. Cl.$^6$ ........................................................ H03D 3/24
[52] U.S. Cl. .......................... 375/376; 375/200; 375/375
[58] Field of Search ................................... 375/200, 204, 375/375, 376; 331/7.8; 332/144

[56] References Cited

U.S. PATENT DOCUMENTS

| | | | |
|---|---|---|---|
| 4,574,243 | 3/1986 | Levine | 327/159 |
| 5,072,298 | 12/1991 | Sumiyoshi | 348/711 |
| 5,113,152 | 5/1992 | Norimatsu | 331/11 |
| 5,144,156 | 9/1992 | Kawasaki | 327/157 |
| 5,166,641 | 11/1992 | Davis et al. | 331/1 A |
| 5,329,250 | 7/1994 | Imaizumi et al. | 331/2 |
| 5,334,953 | 8/1994 | Mijuskovic | 331/8 |
| 5,446,416 | 8/1995 | Lin et al. | 331/11 |
| 5,488,627 | 1/1996 | Hardin et al. | 375/204 |
| 5,491,458 | 2/1996 | McCune, Jr. et al. | 332/144 |
| 5,506,545 | 4/1996 | Andrea | 331/78 |
| 5,521,947 | 5/1996 | Madsen | 375/375 |
| 5,610,558 | 3/1997 | Mittel et al. | 331/2 |
| 5,610,955 | 3/1997 | Bland | 375/376 |
| 5,614,855 | 3/1997 | Lee et al. | 327/158 |
| 5,631,920 | 5/1997 | Hardin | 375/200 |
| 5,659,587 | 8/1997 | Knierim | 375/376 |
| 5,675,291 | 10/1997 | Sudjian | 331/17 |

OTHER PUBLICATIONS

Hardin et al., "Spread Spectrum Clock Generation for the Reduction of Radiated Emissions," Proceedings of IEEE International Symposium on Electromagnetic Compatibility, pp. 227–231, Apr. 4, 1994.

Clark et al., "Application of a PLL and All Noise Reduction Process in Optical Sensing Systems," IEEE Transactions on Industrial Electronics, pp. 136–138, Feb. 1994.

Dussarrat et al., "A New Demodulation Process to Reduce Cochannel Interference for a laser Vibrometer Sensing System," Proceedings of the SPIE, vol. 3411, pp. 2–13, Jun. 1998.

*Primary Examiner*—Stephan Chin
*Assistant Examiner*—Chieh M. Fan
*Attorney, Agent, or Firm*—Stuart T. Auvinen

[57] ABSTRACT

A clock generator produces a frequency-modulated clock. A master phase-locked loop (PLL) includes a voltage summer that outputs a voltage to a voltage-controlled oscillator (VCO). The voltage to the VCO determines the frequency of the clock generated. A modulated voltage is subtracted by the voltage summer to produce voltage and thus frequency modulations. This modulated voltage is produced by a second loop that operates as a slave to the master PLL. The slave loop is a voltage-locked loop. The peak amplitude of the modulated voltage is locked to a control voltage of the master PLL. The control voltage is a stable voltage input to the voltage summer that is generated by phase comparisons of the output clock to a reference clock. To overcome the problem of locking to the modulating output clock, phase comparison is performed only at the same point in the modulation cycle, at the beginning of each modulation cycle. Thus modulations do not affect phase comparisons. The modulated voltage is generated by a waveform generator in the slave loop. The waveform generator is controlled by a feedback divider that also controls when phase comparison is performed. The amplitude of the waveform is adjusted to track the control voltage of the master PLL by comparing the control voltage to the modulated voltage, but only at the beginning of the modulation cycle. The modulation amplitude is kept constant over different supply voltages, ambient temperatures, and process corners.

20 Claims, 4 Drawing Sheets

DUAL-LOOP SPREAD-SPECTRUM CLOCK GENERATOR WITH MASTER PLL AND SLAVE VOLTAGE-MODULATION-LOCKED LOOP

RELATED APPLICATION

This is a Continuation-in-Part (CIP) of "EMI Reduction for a Flat-Panel Display Controller Using Horizontal-Line-Based Spread Spectrum", U.S. Ser. No. 08/701,814, filed Aug. 21, 1996, now U.S. Patent No. 5,757,338.

FIELD OF THE INVENTION

This invention relates to phase-locked-loop (PLL) circuits, and more particularly to a modulated PLL for reduction of electromagnetic interference (EMI) from computer equipment.

BACKGROUND OF THE INVENTION

Phase-locked loops (PLL's) are widely-used circuits. PLL's have traditionally been used to generate clock signals of desired frequencies from an input reference clock. Some PLL's have employed a second loop to further aid in locking, stabilizing, or quickly acquiring the clock frequency at initialization. See for example U.S. Pat. No. 5,329,250 by Imaizumi et al., assigned to Sanyo Electric Co., and U.S. Pat. No. 5,113,152 by Norimatsu, assigned to NEC Corp. Imaizumi uses two PLL loops, each with their own voltage-controlled oscillator (VCO), while Norimatsu uses a variable loop filter.

A more recent application of PLL's is for generating a modulated clock rather than a stable clock. A slow modulation is intentionally introduced into the output clock. This modulation of the clock's frequency is known as spread spectrum. Two VCO's are used by Hardin in U.S. Pat. No. 5,631,920, assigned to Lexmark International, Inc. Bland in U.S. Pat. No. 5,610,955, assigned to Microclock Inc. of San Jose, Calif., uses a single loop, but with a variable divider in the feedback path.

EMI Interference

Electronic equipment can often generate interference that creates disturbances in other electronic equipment. For example, a portable computer may emit radiation that interferes with a television receiver. Intentional receivers, such as televisions, cellular phones, pagers, and wireless devices, are often affected by unintentional transmitters that emit electromagnetic radiation. As both types of electronic equipment become more common, interference becomes more noticeable to the consumer.

Electromagnetic interference (EMI) is a measure of the amount of interference that an electronic device (the unintentional transmitter) disturbs an intentional receiver. Government agencies such as the Federal Communication Commission (FCC) strictly regulate the amount of radiation or EMI that an electronic device can generate.

Portable devices such as portable personal computers (PC's) are particularly problematic since these portable devices are easily placed near televisions or other receivers. Cramped office and living spaces often force electronic equipment closer together. Since radiation rapidly increases with smaller distances, smaller and more portable equipment often appear to generate more interference.

Improving technology also worsens the EMI problem. Faster clock rates of higher-speed PC's generate more radiation. Higher resolution monitors and displays require that more pixels be transferred to the screen for each screen refresh period; thus a higher clock rate and more interference results.

Traditional techniques to reduce EMI attempt to contain radiation or to reduce the amount of radiation generated. Coax wires and shielded cables are effective at containing radiation, but are expensive, heavy, bulky, and inflexible. The weight and bulk of shielded cables make them undesirable for portable computers. The bulk and relative inflexibility of shielded cables makes it difficult to thread them through the clam-shell hinges connecting the graphics controller in the keyboard-containing base unit with the flat-panel display. Metal chassis with sealed seams are effective for reducing EMI of desktop PC's, but portable PC's are kept light by using plastic. Toxic metal paints are sometimes sprayed on plastic housings for portable PC's to provide shielding.

Lower voltages reduce the intensity of the radiation generated, and the new 3-volt standard has helped reduce EMI at all harmonics. Proper impedance matching and termination of signals reduces ringing and harmonics, and shorter signal traces further reduce radiation. Ground planes on PCB's or ground lines running parallel with signal lines effectively shield signals on boards. Filtering can reduce sharp rise and fall times and reduce radiation by wave shaping since more sinusoidal waves have fewer harmonics than square waves. Of course, filters require additional capacitors, resistors, or inductors, raising the cost. All of these techniques are useful to varying extents.

Frequency Modulation - Spread Spectrum

A newer technique to reduce EMI is to vary or modulate the frequency of clocks in the PC. This technique known as spread spectrum, since the frequency spectrum of the clock is spread out over a wider range of frequencies. FIG. 1 shows a graph of radiation intensity as a function of frequency for an un-modulated clock signal. A sharp spike occurs at a harmonic of the clock's frequency, 40 MHz. Since the clock constantly operates at the rated frequency, all of the energy of the radiation appears in a narrow spike, which has a large amplitude. The spike has an amplitude over the EMI limit set by the FCC. The high intensity of the spike can cause interference in a receiver.

FIG. 2 is a graph of radiation intensity as a function of frequency generated by a modulated clock. The clock's frequency is not constant, but is varied with time over a range of +5% to −5% of the rated frequency. Thus the clock operates at 40 MHz for a period of time, but also operates at other frequencies between 38 MHz and at 42 MHz at other times. Such a clock can be generated by slowly changing the frequency from 38 MHz to 42 MHz and then slowly reducing the frequency back to 38 MHz. A voltage-controlled oscillator (VCO) can be used with the input voltage being slewed back and forth between voltages that generate 38 MHz and 42 MHz oscillations.

Since the modulated clock spends only part of the time at 40 MHz, the intensity of the radiation, averaged over a relatively long time, is reduced. The total energy of the radiation at all frequencies is about the same as for the un-modulated clock of FIG. 1, but the intensity at any particular frequency is greatly reduced. Interference at any one frequency is reduced since receivers generally are tuned to a particular frequency (even FM receivers are tuned to a relatively small range of frequencies).

Thus modulating the clock's frequency reduces the maximum intensity of radiation at any one frequency, although the energy radiated at all frequencies is not reduced. This has the practical effect of reducing interference for receivers tuned to a fixed frequency.

The clock's frequency must not change too rapidly. Rapid variations in clock frequency can cause set-up/hold-time problems in logic circuits, and in some cases upset phase-locked loops (PLL's) driven by the modulated clock. These PLL's can lose the phase lock and produce erratic outputs. Thus the frequency is modulated slowly. The clock's frequency must not change too slowly, to avoid losing the benefit of EMI reduction.

Graphics controllers in particular have many clocks derived from the input graphics clock. For instance, for SVGA resolution mode a basic clock is multiplied and divided to generate a 40 MHz pixel clock, a 37 KHz HSYNC clock, and a 60 Hz VSYNC clock, and perhaps a 5 MHz character clock. Different resolutions can require that the clock multiplier and divisors be changed to produce signals with the desired timing for that selected resolution.

Phase-locked loops (PLL's) generate a clock by comparing the phase of an input clock to the phase of a generated clock, which is fed back to the phase comparator. The output of the phase comparator is filtered and then input to a voltage-controlled oscillator (VCO). The VCO varies the frequency of the generated clock as the filtered voltage from the phase comparator varies.

The frequency of the generated clock from the VCO does not have to be the same as the frequency of the input clock. The input clock can be divided by a counter to reduce the frequency of the generated clock (clock divisor), while the generated clock fed back to the phase comparator can be divided to increase the frequency of the generated clock (clock multiplier).

These changeable divisors and multipliers can delay phase comparison by many clock periods, resulting in added delays until a modulation in the clock frequency is responded to. For example, a divisor or multiplier of 16 causes the phase comparison to be delayed up to 16 clock periods. The modulated frequency of the PLL will not change until these delayed phase comparisons are made. Normally it takes three to four phase comparisons (depending on the PLL's open loop gain) before the output frequency settles to within 90% of the newly-set frequency. This results in difficulties in finely controlling the modulation, and inaccuracy in the amount of modulation.

Typically the loop filter values in these PLL's are made large to provide low jitter with a stable reference clock. When this reference clock is purposely modulated, the PLL is no longer operating with a stable reference as it was designed for. This can upset the PLL and introduce more jitter than anticipated.

Long Sweep Period of Modulation—FIG. 3

FIG. 3 is a graph of a modulated clock's frequency as a function of time over a few sweep periods. The clock's nominal frequency is 40 MHz. The clock is modulated by +/−5%, from 38 MHz to 42 MHz. The clock's frequency is swept from minimum to maximum frequencies over one or two thousand clock periods so that adjacent clock pulses have a very small variation. A 40 MHz clock with a 25 nanosecond (ns) period is varied from 26.25 ns to 23.75 ns over a sweep period, a variation of +/−1.25 ns. A 37 KHz sweep rate has a sweep period of 27 micro-seconds ($\mu s$). A sweep period is 27 $\mu s$ / 25 ns or 1081 clock periods. The cycle-to-cycle period variation for two adjacent clock periods is thus 5 ns / 1081 or 4.62 pico-seconds (ps). This small cycle-to-cycle variation is needed to prevent PLL's from losing their phase lock. The sweep frequency is typically 15 to 50 KHz.

A related application for "EMI Reduction for a Flat-Panel Display Controller Using Horizontal-Line-Based Spread Spectrum", U.S. Ser. No. 08/701,814, now U.S. Pat. No. 5,757,338, discloses a spread-spectrum PLL that adjusts the feedback divisor. The modulation rate is synchronized with the horizontal refresh rate of the display to eliminate visible distortions.

Intentional Modulation Disturbs PLL Frequency-Lock

While prior-art modulated clock generators exist, often the stability of the generated clock is compromised when an intentional modulation is introduced. Introducing modulation into a PLL disturbs the frequency-lock and stability of the PLL. Often the amount of modulation must be reduced to maintain frequency-lock. Reducing the amount of modulation is undesirable since the amount of EMI reduction is curtailed.

What is desired is a modulated clock-generator circuit. A more stable clock generator is desired for generating modulated clocks. A PLL-based clock generator that locks in the output frequency even though the output frequency is modulated is desirable. A circuit that more effectively isolates the modulation from the frequency-lock is desired.

SUMMARY OF THE INVENTION

A modulated clock generator has a master phase-locked loop (PLL) that receives a reference clock and outputs a modulated clock. The master PLL includes a feedback divider that receives the modulated clock. It generates a pulse after every M cycles of the modulated clock. A phase comparator receives the reference clock and the pulse from the feedback divider. It compares a phase of the reference clock to a phase of the pulse when the pulse is received. The phase comparator outputs a phase-difference signal.

A summer receives the phase-difference signal from the phase comparator. It combines a modulated signal with the phase-difference signal to generate a frequency-determining signal. A frequency generator generates the modulated clock with a frequency determined by the frequency-determining signal from the summer. The frequency varies over time when the modulated signal varies over time.

A slave voltage-locked loop (VLL) has a waveform generator coupled to the feedback divider. It generates the modulated signal to the summer in the master PLL. The modulated signal is synchronized to the pulse from the feedback divider. A slave comparator receives the phase-difference signal from the phase comparator and receives the modulated signal from the waveform generator. It outputs a difference signal when the phase-difference signal has a same voltage as the modulated signal.

A second phase comparator is coupled to supply a level signal to the waveform generator. It compares the difference signal from the slave comparator to the pulse from the feedback divider when the pulse is received. Thus the slave VLL generates the modulated signal for the master PLL.

In further aspects of the invention the phase comparator and the second phase comparator ignore inputs when the pulse from the feedback divider is not received. The phase comparator and the second phase comparator perform phase comparisons only when the pulse is received. The modulated signal and the modulated clock are at a same point in a modulation cycle when the pulse is generated by the feedback divider. One modulation cycle occurs in a period of time between adjacent pulses from the feedback divider. Thus the modulation cycle is synchronized to the feedback divider.

In further aspects, changes in a power-supply voltage or temperature alter the phase-difference signal from the phase comparator. The modulated signal is adjusted by the slave VLL to track the phase-difference signal.

In other aspects the frequency generator is a voltage-controlled oscillator (VCO) that generates the modulated clock with a frequency determined by a voltage of the frequency-determining signal from the summer.

In further aspects of the invention the level signal from the second phase comparator determines a voltage level of the modulated signal but not a timing of the modulated signal. The feedback divider determines a modulation period of the modulated signal. Thus the modulation period is synchronized to the master PLL.

In still further aspects the modulated signal is scaled before is combined by the summer. The summer subtracts the modulated signal from the phase-difference signal from the phase comparator.

In other aspects, M is a total number pixels in a horizontal line of a display.

DETAILED DESCRIPTION

The present invention relates to an improvement in modulated clock generators. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Modulation by Slave Loop Isolated from PLL

The inventors have realized that the stability of the frequency-lock of the PLL is disturbed by the intentional introduction of clock modulation. The PLL's stability can be improved if the modulation can be isolated from the frequency-locking portion of the PLL. The inventors separate the modulation from the frequency-lock of the PLL by creating a second or slave loop for modulation. This slave modulation loop generates the modulation signal for the primary or master PLL. The modulation signal from the slave loop is introduced into the master loop after the frequency-locking portion, just before the output frequency is generated. Thus the output clock is modulated, but the frequency-lock is isolated from the modulation.

The slave loop is not a second PLL, since it does not include a voltage-controlled oscillator (VCO). The second loop generates the slow modulation as a varying voltage. This voltage is used to adjust the frequency of the primary PLL loop. The slave loop cannot generate a frequency different from that of the first loop. Instead, the slave loop modulates the adjustment voltage over a cycle (period) equal to the phase comparison period of the primary PLL loop.

Slave Loop Synchronized to PLL

The slave loop is synchronized to the primary PLL loop. The slave loop generates modulation that completes a cycle exactly in step with the frequency-lock of the primary PLL loop. When the primary PLL loop compares the phases of the reference clock and the feedback clock, the modulation is always at the same point in the modulation cycle. Thus the modulation is exactly the same each time the frequency comparison occurs. Since the modulation does not vary when the frequency lock occurs, the modulation is effectively isolated from frequency locking.

Figure 1:
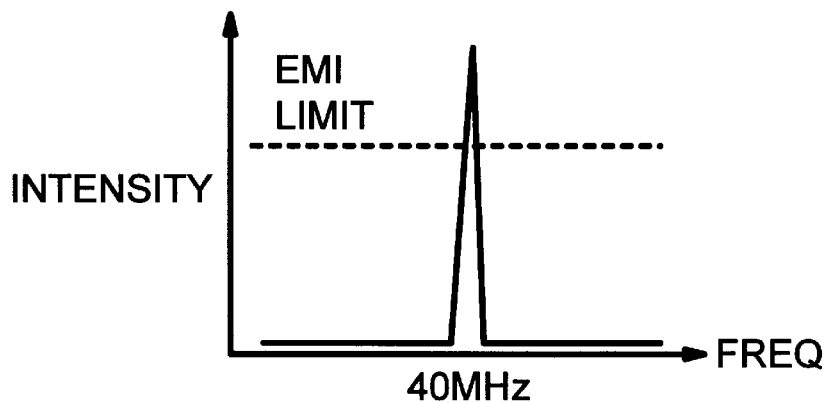
FIG. 1 shows a graph of radiation intensity as a function of frequency for an unmodulated clock signal.
Figure 2:
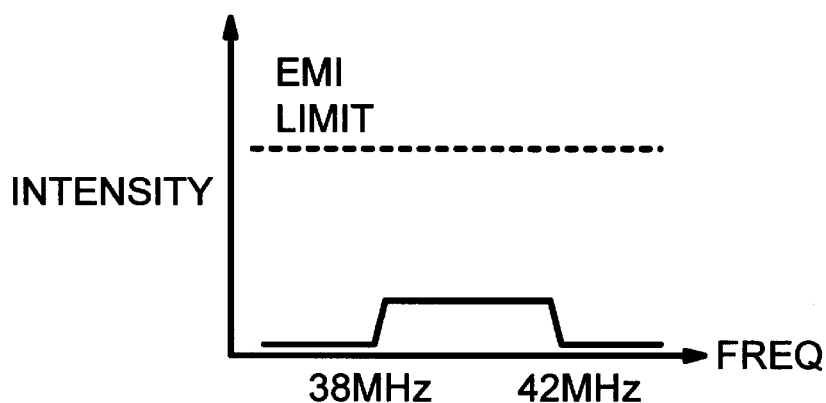
FIG. 2 is a graph of radiation intensity as a function of frequency generated by a modulated clock.
Figure 3:
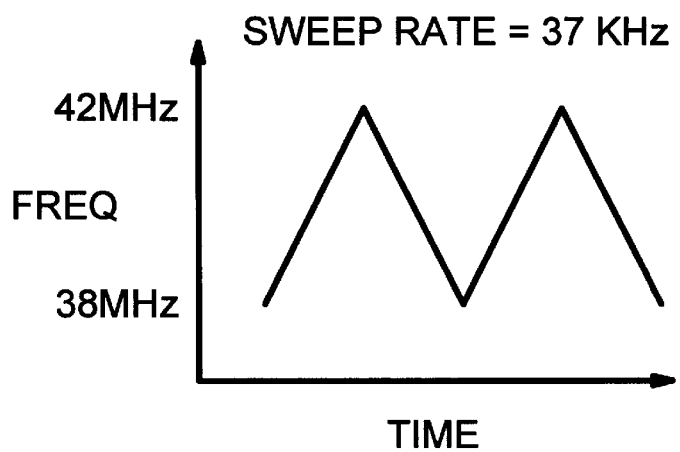
FIG. 3 is a graph of a modulated clock's frequency as a function of time over a few sweep periods.
Figure 4:
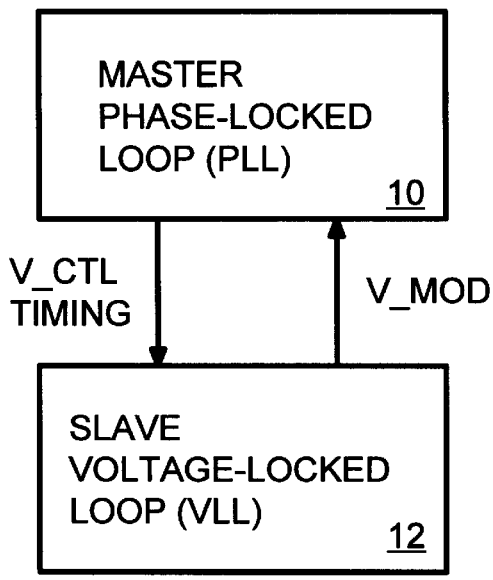
FIG. 4 is a diagram of a modulated clock generator with a master PLL and a slave voltage-locked loop (VLL) for generating modulations.

Master PLL and Slave Voltage-Locking Loop—FIG. 4

FIG. 4 is a diagram of a modulated clock generator with a master PLL and a slave modulated-voltage-locked loop. Master PLL 10 is a standard PLL that also includes a voltage summer just before a VCO that generates the output clock. A modulated voltage V_MOD is input to this voltage summer to adjust the voltage to the VCO. As V_MOD varies, the voltage to the VCO is varied, and thus the output clock frequency varies (is modulated).

The modulated voltage V_MOD is generated by a second loop, slave voltage-locked loop 12. This second loop does not include a VCO of its own, but instead receives timing information from the primary loop, master PLL 10.

Slave voltage-locked loop compares a control voltage V_CTL from master PLL 10 to the modulated voltage V_MOD. Slave voltage-locked loop 12 "locks" these two voltages to each other; thus it is referred to as a voltage-locked loop.

Frequency or phase comparison occurs in both master PLL 10 and slave voltage-locked loop 12 at exactly the same time. The modulation period of V_MOD is exactly synchronized with this phase-comparison period. Although V_MOD varies, it always returns to its starting point when phase comparison occurs. Thus V_MOD and V_CTL are equal at the beginning of the slow modulation cycle, when phase comparison occurs. After phase comparison occurs, V_MOD changes as it cycles through a modulation cycle, returning to its initial voltage just as the next frequency modulation occurs.

Figure 5:
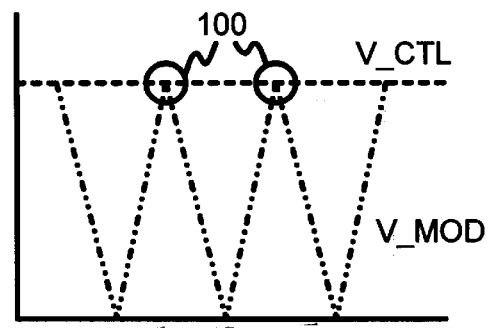
FIG. 5 is a timing diagram showing that the phase comparison for frequency-lock occurs at the start of every modulation sweep cycle.

Modulation Cycle Matches Phase-Comparison—FIG. 5

FIG. 5 is a timing diagram showing that the phase comparison for frequency-lock occurs at the start of every modulation sweep cycle. The control voltage V_CTL from the master PLL is generated by a phase and frequency comparison that is performed during times 100. Even though the clock output from the master PLL varies in frequency, the clock output always has the same frequency at times 100 since the modulation cycle begins and ends at times 100.

The modulated voltage V_MOD generated by the slave voltage-locked loop varies from V_CTL during a modulation cycle. However, the modulation cycle begins and ends at times 100 since the modulation is exactly synchronized to the frequency-lock period of the master PLL loop.

Since the control voltage V_CTL from the master PLL is always equal to the modulated voltage V_MOD from the slave voltage-locked loop at times 100, the slave loop remains locked to the primary loop. The primary loop is not disturbed by the modulation because the modulation always finishes by the time phase or frequency comparison occurs, at times 100.

Voltages Locked

The slave voltage-locked loop compares V_CTL to V_MOD only at times 100. Should the master PLL adjust its control voltage V_CTL, such as caused by process variations of the wafer fab the slave voltage-locked loop alters its control voltage V_VLL to rematch V_MOD at time 100 to match the new V_CTL. Thus the second loop is a voltage-locked loop (VLL).

Figure 6:
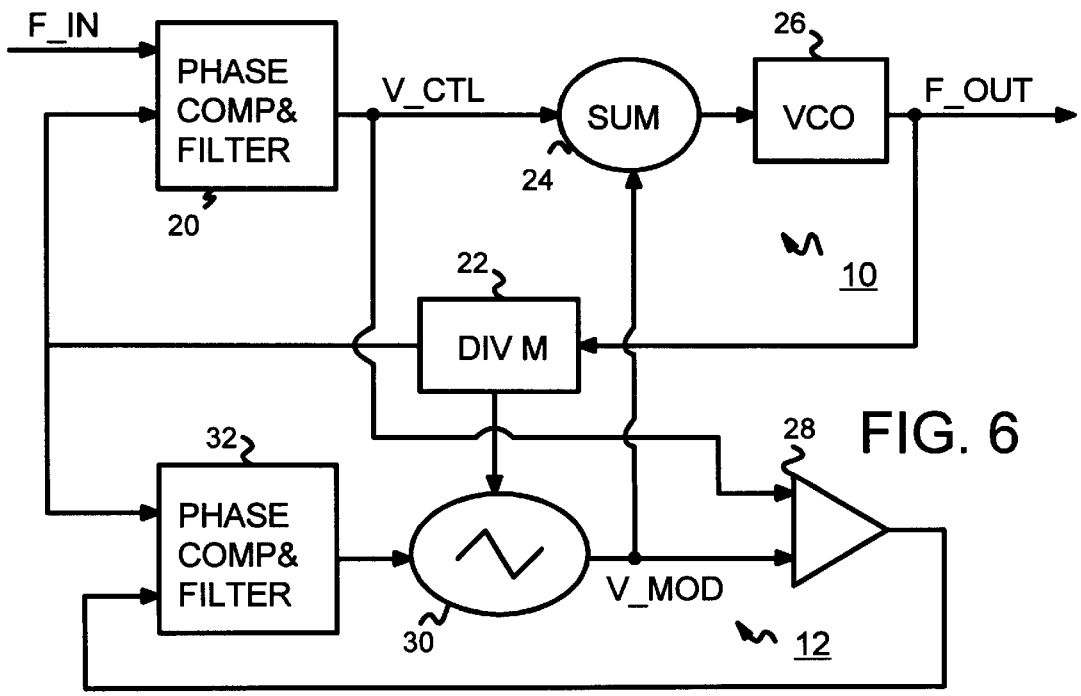
FIG. 6 is a simplified diagram of a modulated clock generator with a master PLL and a slave VLL for frequency modulation.

Simplified Diagram of PLL-VLL—FIG. 6

FIG. 6 is a simplified diagram of a modulated clock generator with a master PLL and a slave VLL for frequency modulation. Master PLL 10 is a loop that includes phase comparator 20, summer 24, VCO 26, and divider 22. An input reference clock F_IN is compared to the feedback from divider 22 by phase comparator 20. This comparison does not occur continuously but for each pulse from divider 22. Phase comparator 20 includes a phase and frequency comparator, a charge pump, and a loop filter. The control voltage V_CTL is output from phase comparator 20. This control voltage remains constant despite frequency modulation.

Voltage summer 24 subtracts the modulation voltage V_MOD from the control voltage V_CTL. The output of summer 24 is a voltage applied to VCO 26. As V_MOD is changed by slave VLL 12, the voltage output by summer 24 also varies, causing the frequency generated by VCO 26 to vary.

Divider 22 receives the modulated output clock from VCO 26 and divides it by the constant M. After M pulses of the output clock are received by divider 22, it outputs one pulse to phase comparator 20. Thus phase comparison occurs only once for every M pulses of the output clock (F_OUT).

The output from divider 22 is also sent to phase comparator 32 in slave VLL 12. Thus phase comparison occurs at the same time for both loops, once every M output-clock pulses. Phase comparator 32 includes a phase comparator, a charge pump, and a loop filter. It outputs a stable voltage to waveform generator 30, providing the desired modulation.

Waveform generator 30 generates a modulation profile, in this case, a sawtooth waveform from phase comparator 32, synchronized to divider 22. Divider 22 determines when to begin and end each cycle so that the cycle is exactly the same as M periods of the output clock F_OUT. The voltage amplitude of the waveform is determined by the voltage from phase comparator 32, while the period is determined by divider 22.

The waveform from waveform generator 30 is the modulated voltage V_MOD, which is sent to summer 24. As waveform generator 30 modulates voltage V_MOD, VCO 26 varies the output frequency.

Even though the frequency is modulated, the frequency comparison by phase comparators 20, 32 occurs at the same time in the modulation cycle, when divider 22 outputs a pulse. This pulse resets waveform generator 30 to begin a new modulation cycle. Since the modulations of voltage V_MOD occur between pulses from divider 22, these modulations are not compared by comparators 20, 32.

Voltage comparator 28 compares the control voltage V_CTL from master PLL 10 to the modulated voltage V_MOD from slave VLL 12. Although voltage comparator 28 continuously compares these voltages, phase comparator 32 ignores these voltage comparisons in the middle of the modulation cycle, and only phase-compares the output from voltage comparator 28 at the end of the modulation cycle, when divider 22 outputs a pulse and resets waveform generator 30. Thus phase comparator 32 samples voltage comparator 28 when it compares V_CTL to the initial V_MOD, when V_CTL is nominally equal to V_MOD. Any voltage difference is the result of temperature or other variations in master PLL 10 or slave VLL 12. These variations are tracked by slave VLL 12 adjusting the initial V_MOD to account for the change in V_CTL. Thus slave VLL 12 is locked to the control voltage from master PLL 10.

Figure 7:
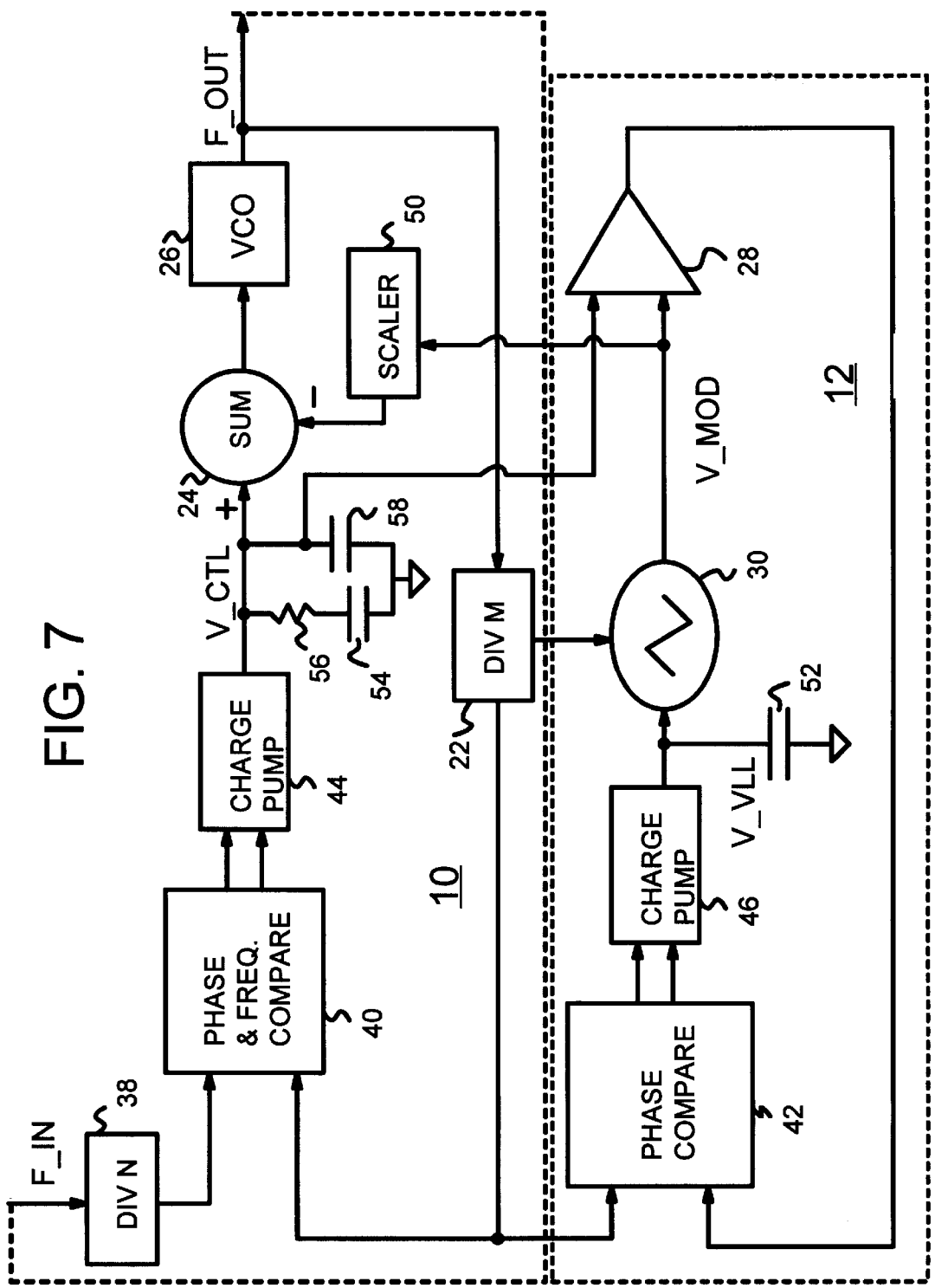
FIG. 7 is a detailed schematic of the master PLL and slave VLL for the modulated clock generator.

Detailed Schematic of Master PLL and Slave VLL—FIG. 7

FIG. 7 is a detailed schematic of the master PLL and slave VLL for the modulated clock generator. A reference clock F_IN is optionally divided by N in divider 38 and then applied to phase and frequency comparator 40. The output clock has a nominal frequency in the ratio of M/N, where M is the divisor for feedback divider 22. The output clock F_OUT is often further divided, such as in a divide-by-two divider (not shown).

Phase and frequency comparator 40 compares the phase of the divided reference clock from divider 38 to the pulse from divider 22. The frequency as well as the phase are compared because comparator 40 checks which of the reference and feedback clock signals arrives first. If reference signal arrives first, meaning VCO is running too slow, a UP signal is generated, and vice versa. The Up and Down signals generated from phase and frequency comparator 40 are sent to charge pump 44, which sources or sinks charge to and from the loop filter on the V_CTL node. As charge is sourced to capacitors 54, 58, V_CTL increases, which ultimately increases the voltage input to VCO 26 and increases the frequency to compensate for the phase or frequency difference.

Resistor 56 and capacitors 54, 58 form a loop filter that slows down the response of master PLL 10. The loop filter is useful for filtering out high frequency variations. The value of the loop's time constant can be varied by adjusting the capacitive and resistive values of the loop filter.

Summer 24 subtracts a preset scaled V_MOD from the control voltage V_CTL (such as 2%) and outputs a modulated voltage to VCO 26. VCO 26 generates a clock with a frequency that varies (2%) with the voltage from summer 24. Since the VLL locks to V_CTL, the amount of modulation (2%) is guaranteed regardless of supply voltage, temperature, and process variations in IC circuits.

The pulse output from divider 22 after every M output clock pulses is also compared by phase comparator 42 in slave VLL 12. An up and a down signal output from phase comparator 42 controls a current source and a current sink in charge pump 46, which partially charge or discharge capacitor 52. This increases or decrease voltage V_VLL, the nominal lock voltage of slave VLL 12. Voltage V_VLL is relatively constant, as is V_CTL, the control voltage from master PLL 10. These two voltage are locked together by slave VLL 12. When V_CTL increases, V_VLL also changes to track it.

VCO 26 introduces a pole (1/s) to convert frequency to phase. Since no VCO is present in VLL 12, VLL 12 is a single pole (i.e. first-order loop) feedback system. As a result, a full R-C filter is not needed. This simplifies the circuit design and greatly eases the stability constraint, because a first-order negative feedback loop is unconditionally stable.

Waveform generator 30 uses the nominal control voltage V_VLL across capacitor 52 and generates a sawtooth waveform in synch with the M pulse from divider 22. Thus the period or cycle time of the modulation is set by divider 22, but the initial and average voltages generated by waveform generator 30 are determined by the voltage from capacitor 52. Divider may output additional timing signals to waveform generator 30, such as a mid-cycle signal to reverse the direction of the voltage changes in the middle of the modulation cycle, and M/2. Waveform generator 30 could be programmable for the type of waveform generated and the midpoint.

Waveform generator 30 outputs the modulated voltage V_MOD, which is compared by voltage comparator 28 to the master PLL's control voltage V_CTL. Although V_MOD varies, the voltage comparison from voltage comparator 28 is only sampled by phase comparator 42 at each M pulse output from divider 22. This occurs at the start and end of the modulation cycle, when V_MOD has returned to its initial value.

The modulated voltage V_MOD is scaled to be subtracted from V_CTL. V_MOD may not be scaled to the desired modulation, so scaler 50 attenuates the modulation voltage to a desired value for input to voltage summer 24. The amount of frequency modulation is usually small compared to the frequency generated. A 40 MHz output clock may only be modulated by 5%, or 2 MHz. Thus the modulated voltage V_MOD should be scaled to be only 5% or less of the control voltage V_CTL because output frequency F_OUT is directly proportional to V_CTL. Scaler 50 attenuates the modulation voltage V_MOD by 90% or 95%, depending on the amount of frequency modulation desired. A voltage divider can be used for scaler 50. Comparator 28 outputs a pulse when V_MOD matches V_CTL. This pulse is phase compared with the output from divider 22. Should there be any difference, then V_VLL is adjusted accordingly to synchronize the modulation sawtooth voltage with the master PLL.

Figure 8:
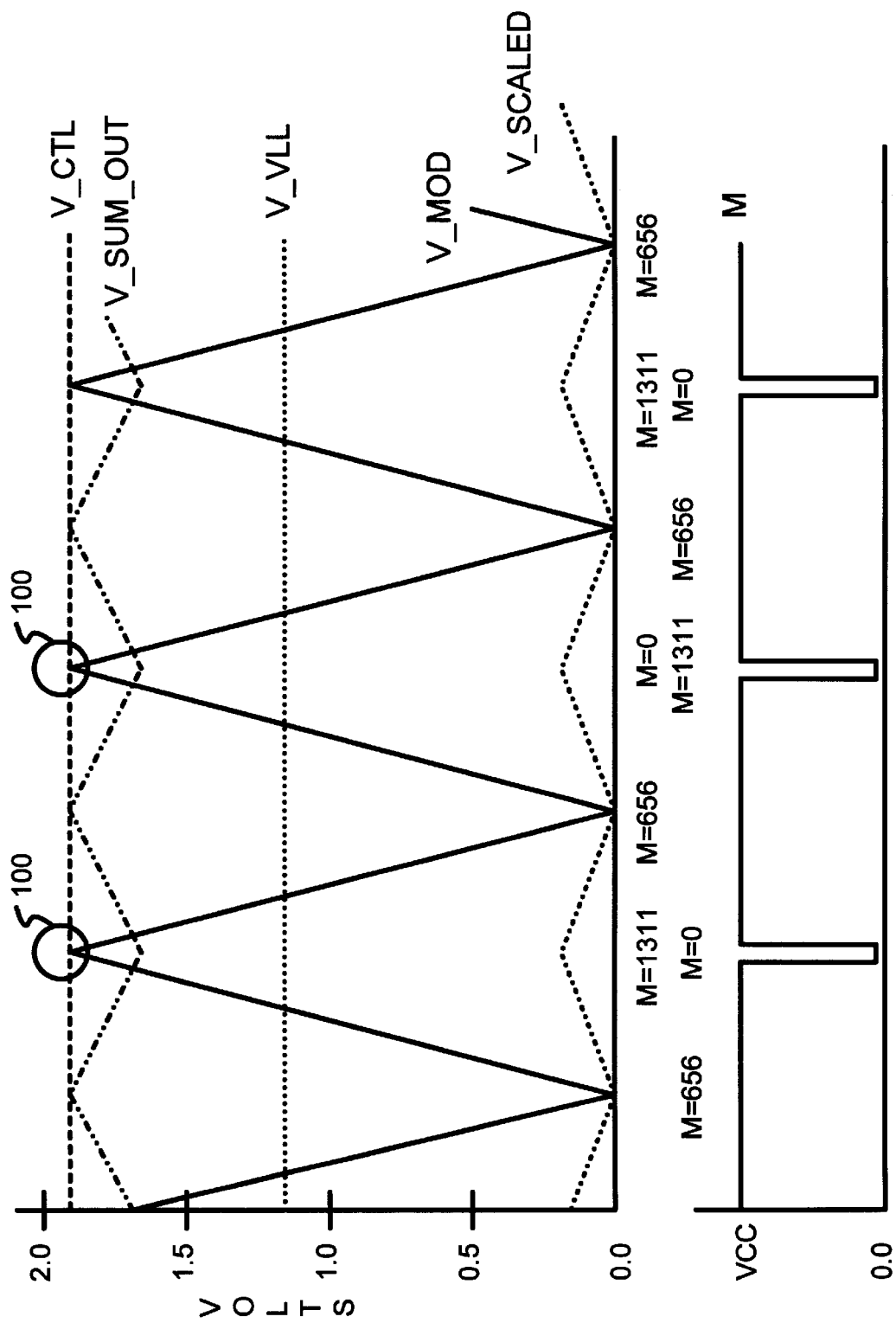
FIG. 8 is a waveform diagram of the steady-state operation of the modulated clock generator of FIG. 7.

Waveform Diagram—FIG. 8

FIG. 8 is a waveform diagram of the steady-state operation of the modulated clock generator of FIG. 7. The feedback divider counts M pulses of the output clock and then outputs a single low-going pulse as signal "M". The feedback counter counts from M=0 to M=1311 for 1024× 768 resolution. This count from M=0 to M=1311 is shown on the horizontal axis and defines a modulation cycle. Three complete modulation cycles are shown in FIG. 8.

The control voltage V_CTL of the master PLL, and the nominal lock voltage V_VLL of the slave VLL remain relatively constant in steady-state operation. During system initialization, these signals rise from ground and fluctuate as the clock is being acquired and locked.

As the feedback divider counts down from M=1131 to 0, waveform generator 30 of FIG. 7 incrementally decreases the modulation voltage V_MOD until M reaches its midpoint, M=656. Then it incrementally increases the modulation voltage until the initial voltage is reached again when the feedback divider reaches M=0, and outputs the M pulse. The waveform generator receives the nominal lock voltage V_VLL, which normally remains constant through the modulation cycle. V_VLL only changes when the steady state is altered and V_CTL has changed. The waveform generator can be another charge pump but with a variable pump-current controlled by the input voltage V_VLL when generating the modulated voltage V_MOD.

The modulated voltage V_MOD is too large in magnitude for the desired frequency modulation, so it must be attenuated. The scaled modulated voltage V_SCALED swings from 0 to 200 mV while V_MOD swings from 0 to about 2.0 volts. Thus the signal is attenuated by 90%.

The scaled modulated voltage V_SCALED is subtracted from the stable control voltage V_CTL by the voltage summer in the master PLL. The result is V_SUM_OUT, which is a modulated voltage sent to the VCO. Since the voltage V_SUM_OUT modulates from about 2.0 volts to 1.8 volts, the frequency generated is also modulated.

The phase comparisons in both the master PLL and slave VLL are performed only during the M pulse, since the M pulse is sent to the phase comparators. Thus the master PLL compares the M pulse to the reference clock when the slave VLL compares the voltages V_CTL to V_MOD. The modulated voltage is at 2.0 volts, about equal to V_CTL, during the M pulse, as shown in times 100. Thus there is no adjustment to either loop in steady-state. Fluctuations from steady state cause phase or voltage mis-compares, which adjust the level of the control or modulated voltages to compensate.

Divisor Matches Horizontal Period

For a graphics display system, the value of M is preferably equal to or a fraction of the number of pixels in a horizontal line of a display. M can be any number when used in other systems that require a modulated clock. M is the total number of pixels, not just the number of displayed pixels. Thus for 1024×768 resolution, each horizontal line has 1024 displayable pixels. The horizontal time period also includes non-displayed pixels, such as those when a CRT's horizontal re-trace and blanking occurs. Thus for 1024×768 resolution, M is set to 1311. Of course, many other values of M are possible, even for the same resolutions, depending on the blanking period programmed.

ADVANTAGES OF THE INVENTION

The modulated clock-generator circuit uses a slave loop to lock a modulated voltage with the control voltage of the master PLL that generates the modulated clock. A more stable clock generator is shown for generating modulated clocks. A PLL-based clock generator locks in the output frequency even though the output frequency is modulated. The circuit more effectively isolates the modulation from the frequency-lock. Thus stability of the PLL is improved, even though modulations are introduced that might otherwise upset the frequency lock and stability of the PLL.

The sensitive control node of the master PLL is isolated from the modulations. This prevents the modulations from disturbing the charge stored on the loop filter's capacitors. Stability is thus improved. Power-supply voltages, temperature, process, and clock loading that can affect the PLL are accounted for by the separate voltage-lock of the slave loop that generates the modulations. The slave loop provides a constant modulation in all conditions, since its output tracks the control voltage in the master PLL. The slave's loop filter is simply a capacitor, which results in a simple, one-pole design. The slave's waveform generator can use a charge-pump-type current integrator that results in a very smooth sawtooth-shaped modulation voltage. This simple, first-order, slave loop is unconditionally stable because of the simple filter. In contrast, the VCO in the master loop introduces a second pole. This adds instability to the master loop that is not present in the slave loop. because the phase changes 180 degree (with 2 poles), and combining the negative feedback configuration produces a positive feedback system.

A digital-to-analog converter (DAC) is not needed, eliminating jitter from discrete steps from the DAC. A second VCO is also eliminated, reducing cost and complexity. Synchronizing the phase comparisons to the modulation cycle has the effect of fooling the master loop into behaving as an un-modulated PLL. The modulations are not seen when the phase comparisons are sampled.

ALTERNATE EMBODIMENTS

Several other embodiments are contemplated by the inventors. For example a sine wave or other kinds of waveforms for modulation can be generated instead of the sawtooth wave described. The voltage comparator and summer can be implemented with op amps or other circuits. The entire circuit is preferably integrated onto a single integrated circuit, such as with a graphics controller.

The clock generator can be applied to other systems besides graphics systems. Polarities of signals can be reversed, and a voltage summer that adds rather than subtracts the scaled, modulated voltage can be substituted. More than one cycle of modulation can occur between each pulse from the feedback divider.

There are digital counterparts of analog PLL's that can be substituted. The charge pump and loop filter can be substituted by an up/down counter, and the VCO replaced by digitally-controlled delay circuits.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A modulated clock generator comprising:
   a master phase-locked loop (PLL), receiving a reference clock and outputting a modulated clock, the master PLL comprising:
   a feedback divider, receiving the modulated clock, for generating a pulse after every M cycles of the modulated clock;
   a phase comparator, receiving the reference clock and the pulse from the feedback divider, for comparing a phase of the reference clock to a phase of the pulse when the pulse is received, the phase comparator outputting a phase-difference signal;
   a summer, receiving the phase-difference signal from the phase comparator, for combining a modulated signal with the phase-difference signal to generate a frequency-determining signal;
   a frequency generator for generating the modulated clock having a frequency determined by the frequency-determining signal from the summer, the frequency varying over time when the modulated signal varies over time; and
   a slave voltage-locked loop (VLL) comprising:
   a waveform generator, coupled to the feedback divider, for generating the modulated signal to the summer in the master PLL, the modulated signal being synchronized to the pulse from the feedback divider;
   a slave comparator, receiving the phase-difference signal from the phase comparator and receiving the modulated signal from the waveform generator, for outputting a difference signal when the phase-difference signal has a same voltage as the modulated signal;
   a second phase comparator, coupled to supply a level signal to the waveform generator, for comparing the difference signal from the slave comparator to the pulse from the feedback divider when the pulse is received,
   whereby the slave VLL generates the modulated signal for the master PLL.

2. The modulated clock generator of claim 1 wherein the phase comparator and the second phase comparator ignore inputs when the pulse from the feedback divider is not received, the phase comparator and the second phase comparator performing phase comparisons only when the pulse is received.

3. The modulated clock generator of claim 1 wherein the modulated signal and the modulated clock are at a same point in a modulation cycle when the pulse is generated by the feedback divider.

4. The modulated clock generator of claim 3 wherein one modulation cycle occurs in a period of time between adjacent pulses from the feedback divider, whereby the modulation cycle is synchronized to the feedback divider.

5. The modulated clock generator of claim 1 wherein changes in power-supply voltage or temperature alter the phase-difference signal from the phase comparator, and wherein the modulated signal is adjusted by the slave VLL to track the phase-difference signal.

6. The modulated clock generator of claim 1 wherein the frequency generator is a voltage-controlled oscillator (VCO) generating the modulated clock with a frequency determined by a voltage of the frequency-determining signal from the summer.

7. The modulated clock generator of claim 6 wherein the level signal from the second phase comparator determines a voltage level of the modulated signal but not a timing of the modulated signal, and wherein the feedback divider determines a modulation period of the modulated signal,
   whereby the modulation period is synchronized to the master PLL.

8. The modulated clock generator of claim 7 wherein the modulated signal is scaled before being combined by the summer.

9. The modulated clock generator of claim 8 wherein the summer subtracts the modulated signal from the phase-difference signal from the phase comparator.

10. The modulated clock generator of claim 9 wherein M is a total number pixels in a horizontal line of a display.

11. A clock generator for generating a frequency-modulated output clock, the clock generator comprising:
    a master phase-locked loop (PLL) comprising:
    a voltage-controlled oscillator (VCO), receiving a summed voltage, for outputting the output clock having an instantaneous frequency determined by the summed voltage;
    a feedback divider, receiving the output clock from the VCO, for dividing a frequency of the output clock to generate a feedback clock;
    a master phase comparator, receiving a reference clock having a fixed reference frequency, for comparing a phase of the reference clock to a phase of the feedback clock, the master phase comparator outputting a phase-difference signal;
    a loop filter including a capacitor, the loop filter outputting a control voltage;
    a master charge pump, receiving the phase-difference signal from the master phase comparator, for charging and discharging the capacitor in the loop filter in response to the phase-difference signal;
    a summer, receiving the control voltage from the loop filter and receiving a modulated voltage, for outputting the summed voltage as a combination of the control voltage and the modulated voltage; and a slave voltage-locked loop (VLL) comprising:
- a modulation generator, coupled and synchronized to the feedback divider, for generating the modulated voltage having voltage modulations in a modulation cycle;
- a voltage comparator for comparing the modulated voltage to the control voltage from the master PLL and outputting a voltage pulse when the modulated voltage is equal to the control voltage;
- a slave phase comparator, coupled to the voltage comparator and receiving the feedback clock, for generating a slave phase-difference signal;
- a slave loop filter that includes a capacitor, the slave loop filter coupled to the modulation generator;
- a slave charge pump, receiving the slave phase-difference signal, for charging and discharging the slave loop filter in response to the slave phase-difference signal;

whereby modulation is isolated from the loop filter of the master PLL by the slave VLL that generated the modulated voltage.

12. The clock generator of claim 11 wherein the slave loop filter outputs a level signal to the modulation generator, the modulation generator generating the modulated voltage having a level determined by the level signal, whereby the level of the modulated voltage is adjusted by comparison with the control voltage of the master PLL.

13. The clock generator of claim 12 wherein the modulated voltage changes in a modulation cycle, a period of the feedback clock being exactly equal to one or more periods of the modulation cycle.

14. The clock generator of claim 13 wherein the loop filter in the master PLL includes a resistor and a capacitor in series, while the slave loop filter comprises a capacitor without a series resistor, the slave VLL being a first-order loop with a single frequency pole.

15. The clock generator of claim 13 further comprising:
- a scaler for attenuating the modulated voltage before the modulated voltage is combined with the control voltage by the summer.

16. The clock generator of claim 13 wherein the modulated voltage is subtracted from the control voltage by the summer.

17. The clock generator of claim 13 wherein the modulation generator outputs the modulated voltage that forms a sawtooth wave between pulses of the feedback clock.

18. The clock generator of claim 13 wherein the master phase comparator compares a phase and a frequency of the reference clock to the feedback clock, but the slave phase comparator compares only a phase of the voltage pulse to the feedback clock.

19. The clock generator of claim 13 wherein the reference clock is generated by an input divider.

20. The clock generator of claim 13 wherein the feedback divider is synchronized to a horizontal period of a horizontal line of pixels for a display.

* * * * *